(12) United States Patent
Daio

(10) Patent No.: US 7,864,652 B2
(45) Date of Patent: Jan. 4, 2011

(54) GAIN CONTROL CIRCUIT AND OPTICAL RECORDING AND REPRODUCING DEVICE USING THEREOF

(75) Inventor: Katsuhisa Daio, Kagoshima (JP)

(73) Assignee: Sony Corporation, Tokyo (JP)

( * ) Notice: Subject to any disclaimer, the term of this patent is extended or adjusted under 35 U.S.C. 154(b) by 218 days.

(21) Appl. No.: 12/208,817

(22) Filed: Sep. 11, 2008

(65) Prior Publication Data

US 2009/0072908 A1    Mar. 19, 2009

(30) Foreign Application Priority Data

Sep. 14, 2007    (JP)    ............... 2007-239264

(51) Int. Cl.
*G11B 7/00* (2006.01)
*H03G 3/00* (2006.01)

(52) U.S. Cl. .................. 369/124.11; 330/278

(58) Field of Classification Search . 369/124.1–124.12, 369/44.29, 44.35, 44.36, 47.25, 47.27; 330/278, 330/281, 282, 254

See application file for complete search history.

(56) References Cited

U.S. PATENT DOCUMENTS

| 4,799,026 | A | * | 1/1989 | La Barge et al. | ............. 330/254 |
| 6,353,361 | B1 | * | 3/2002 | Sun | ............................. 330/253 |
| 6,954,418 | B2 | * | 10/2005 | Yanagawa et al. | ....... 369/124.15 |
| 7,242,545 | B1 | * | 7/2007 | Cheng | .......................... 360/46 |
| 2005/0147016 | A1 | * | 7/2005 | Morikawa et al. | ......... 369/124.1 |
| 2006/0114766 | A1 | * | 6/2006 | Hsieh et al. | ............... 369/44.13 |
| 2006/0215510 | A1 | * | 9/2006 | Hashimoto | ............... 369/47.28 |

FOREIGN PATENT DOCUMENTS

| JP | 10-276051 | * | 10/1998 |
| JP | 2000049550 | A | * | 2/2000 |
| JP | 2005-045716 | | * | 2/2005 |

* cited by examiner

*Primary Examiner*—Thang V Tran
(74) *Attorney, Agent, or Firm*—SNR Denton US LLP

(57) ABSTRACT

A gain control circuit to determine gain by a current ratio of mutual conductance. The gain control circuit includes a first gain control circuit in which positive and negative phase input signals are supplied, gain is changed based on a first control signal, and positive and negative phase output signals are outputted, a second gain control circuit in which the positive and negative phase input signals are supplied, gain is changed based on a second control signal, and the positive and negative phase output signals are outputted, and a load circuit in which the positive phase output signal of the first gain control circuit and the negative phase output signal of the second gain control circuit are synthesized and supplied to a first input terminal, and the negative phase output signal of the first gain control circuit and the positive phase output signal of the second gain control circuit are synthesized and supplied to a second input terminal, and the synthesized signals are lead out through mutual conductance.

11 Claims, 3 Drawing Sheets

GAIN CONTROL CIRCUIT AND OPTICAL RECORDING AND REPRODUCING DEVICE USING THEREOF

BACKGROUND OF THE INVENTION

1. Field of the Invention

The present invention relates to a gain control circuit to perform signal level control. In particular, the present invention relates to a gain control circuit to extract a wobble signal from the guide groove of a data-writable optical disc, and an optical recording and reproducing device using the gain control circuit.

2. Description of Related Art

In most of VCA (voltage control amplifier) circuits of the related art, the ratio between a mutual conductance gm1 and a mutual conductance gm2 is controlled with direct current by directly changing the in/out current ratio to perform gain control in a bipolar circuit using a Gilbert cell and a similar analog MOS circuit (for example, refer to Japanese Unexamined Patent Application Publication No. JP 10-276051).

When the gain control is performed by this type of circuit, in order to change the individual gm (the mutual conductance), the direct current passing therethrough is changed to control gm. Depending on the gain, the amount of the noise thereof may be varied and the frequency characteristics thereof may also be varied, thereby failing to hold uniform characteristics within a variable range.

That is, the changes in the mutual conductance gm1 and gm2 of the amplifier circuit lead to the change in output offset (generated by the VCA) per gain.

Japanese Unexamined Patent Application Publication No. JP 2005-45716 discloses an amplifier circuit and a semiconductor device having the amplifier circuit. The amplifier circuit includes a differential amplifier circuit and has the circuit configured to add the current changes in the positive phase and the negative phase and feed the resulting current to an additional resistor, while holding a variable current constant.

SUMMARY OF THE INVENTION

The gain control amplifier (circuit) constituting the above amplifier circuit changes a differential pair emitter resistor (re) formed at a 1:4 ratio, thereby making it difficult to form by a MOS (metal oxide semiconductor) circuit. Further, the differential pair in the input stage can have only two stages having the balanced positive phase and negative phase. This makes it impossible to preset an arbitrary gain offset and adjust this independently from the gain of the VCA circuit.

It is desirable to provide a gain control circuit that performs gain control and arbitrarily sets an output DC level without deteriorating electrical characteristics, and provide an optical recording and reproducing device using the gain control circuit.

The gain control circuit of an embodiment of the present invention determines gain by a current ratio of mutual conductance and has a first gain control circuit, a second gain control circuit and a load circuit. In the first gain control circuit, positive phase and negative phase input signals are supplied, gain is changed based on a first control signal, and positive phase and negative phase output signals are outputted. In the second gain control circuit, the positive phase and the negative phase input signals are supplied, gain is changed based on a second control signal, and positive phase and negative phase output signals are outputted. In the load circuit, the positive phase output signal of the first gain control circuit and the negative phase output signal of the second gain control circuit are synthesized and supplied to a first input terminal, and the negative phase output signal of the first gain control circuit and the positive phase output signal of the second gain control circuit are synthesized and supplied to a second input terminal, and the synthesized signals are lead out through the mutual conductance set based on the first control signal and the second control signal, respectively.

The optical recording and reproducing device of an embodiment of the present invention controls the rotation of an optical disc by detecting an optical signal and reproducing a wobble signal and an RF signal. A wobble detection circuit to detect the wobble signal has a gain control circuit determining gain by a current ratio of mutual conductance. The gain control circuit has a first gain control circuit, a second gain control circuit and a load circuit. In the first gain control circuit, positive phase and negative phase input signals are supplied, gain is changed based on a first control signal, and positive phase and negative phase output signals are outputted. In the second gain control circuit, the positive phase and the negative phase input signals are supplied, gain is changed based on a second control signal, and positive phase and negative phase output signals are outputted. In the load circuit, the positive phase output signal of the first gain control circuit and the negative phase output signal of the second gain control circuit are synthesized and supplied to a first input terminal, and the negative phase output signal of the first gain control circuit and the positive phase output signal of the second gain control circuit are synthesized and supplied to a second input terminal, and the synthesized signals are lead out through the mutual conductance set based on the first control signal and the second control signal, respectively.

The gain control circuit and the optical recording and reproducing device using the gain control circuit according to the present invention perform gain control as follows. That is, the positive phase and the negative phase of the output signal currents of the mutual conductance amplifier circuits (the gm amplifiers) in a plurality of input stages are synthesized. The currents of the gm amplifiers are controlled with the control signals. Signal currents outputted from the mutual conductance amplifier circuits are synthesized, and the mixing ratio between the positive phase and the negative phase of the synthesized signal currents is changed and the resulting signals are outputted through the mutual conductance load circuits, respectively.

The gain control circuit and the optical recording and reproducing device using the gain control circuit according to the present invention cause no deterioration of electrical characteristics even when the control amount is changed.

DETAILED DESCRIPTION OF THE EMBODIMENTS

Figure 1:
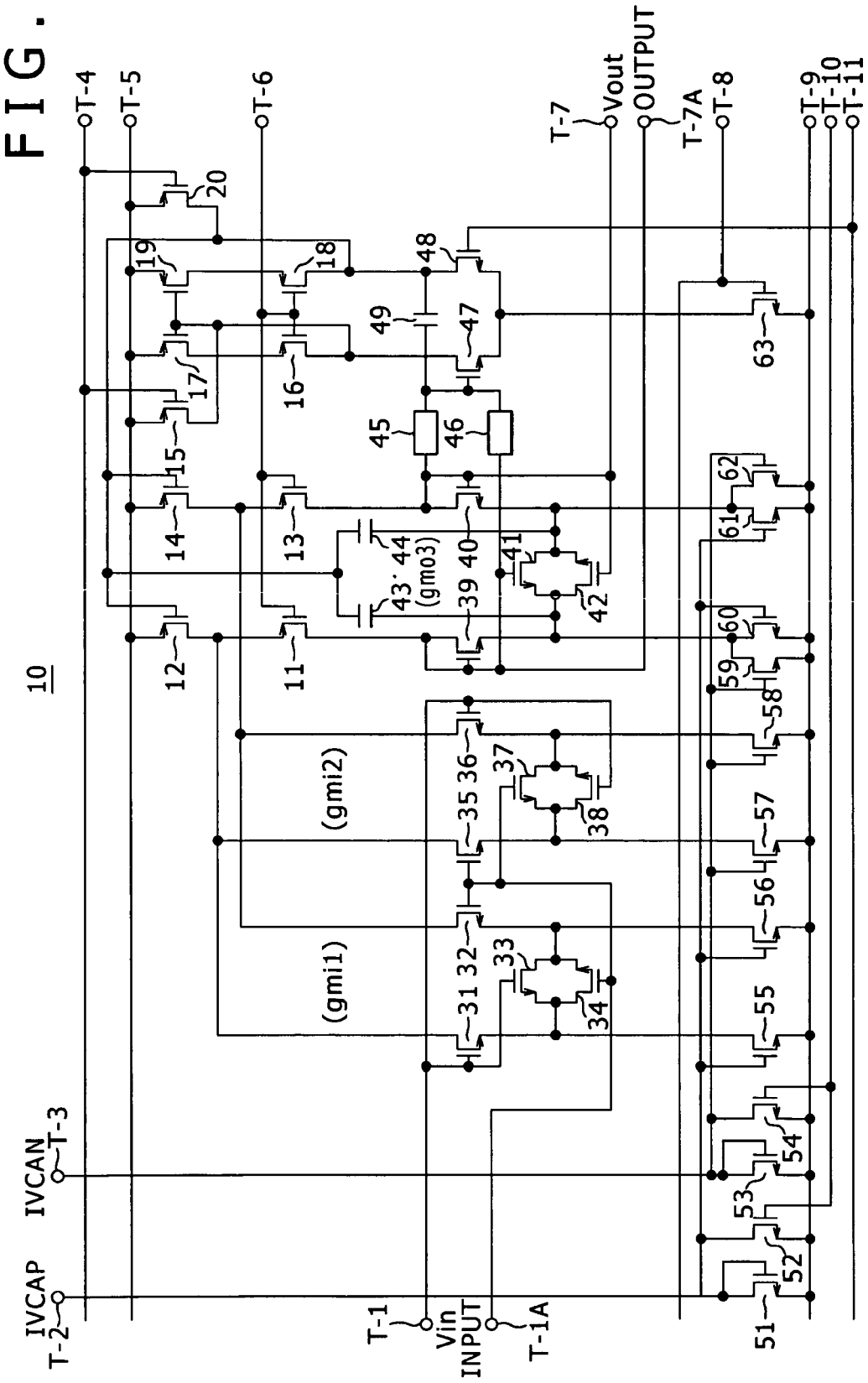
FIG. 1 is a circuit configuration diagram of a gain control circuit of the present invention.

FIG. 1 shows a circuit configuration example of a gain control circuit (VCA) 10 of the present invention.

The gain control circuit 10 is formed by a gmi1 circuit and a gmi2 circuit in the input stage (referred also to as a gmi circuit or a mutual conductance (input) amplifier circuit), and a gmo3 circuit in the output stage (a gmo circuit or a mutual conductance (output) amplifier circuit). Alternatively, the gmi circuit of the input stage may have a multistage configuration depending on the use. The example of the gain control circuit 10 shown in FIG. 1 has a two-stage configuration.

In the input stage, the gmi1 circuit is used as a negative phase input stage and the gmi2 circuit is used as a positive phase input stage. An offset circuit to compensate for the common mode voltage of the output stage (the gmo3 circuit) is newly provided.

The related art circuit is configured to perform gain control by changing DC (direct current), in which the individual gm is determined by the gmi to gmo (gmi/gmo) ratio of mutual conductance. On the other hand, the gain control circuit 10 of the present invention is configured to change the mixing ratio of signal currents in the input stage while surely keeping constant the mutual conductance gmo of the output stage and keeping constant the total gmi of the input stage.

The gain change of the present invention is attained by forming the gmi circuit into a multistage configuration and individually executing input whose polarity is AC-likely inverted, so that the balance between the gmi1 circuit and the gmi2 circuit is changed in the range the total DC current is constant.

Firstly, the terminals connected to the gain control circuit 10 will be described below.

An input signal is supplied to terminals T-1 and T-1A, and a positive phase signal and a negative phase signal are inputted to the gmi1 circuit and the gmi2 circuit, respectively.

From terminals T-2 and T-3, control currents are supplied to transistors (51, 52, 53 and 54) constituting the constant current sources of the gmi1 circuit, the gmi2 circuit and the gmo3 circuit, thereby generating a bias voltage. The values of currents supplied from these two terminals T-2 and T-3 are changed independently of each other in order to control the mutual conductance gm of the gmi1 circuit, the gmi2 circuit and the gmo3 circuit.

From a terminal T-4, a voltage is supplied to an offset circuit. From a terminal T-5, a source voltage is supplied to the gmo3 circuit and the offset circuit.

A terminal T-6 supplies a bias voltage to PMOS transistors 11 and 13 of the gmo3 circuit and PMOS transistors 16 and 18 of the offset circuit.

Terminals T-7 and T-7A output the signals lead out of the gmo3 circuit.

A terminal T-8 supplies a bias voltage to an NMOS transistor 63 constituting the constant current source.

A terminal T-9, to which a reference voltage is supplied, is set to 0 V (ground), for example.

A terminal T-10 supplies a bias to the gates of the NMOS transistors 52 and 54 of the constant current source, and correspondingly controls the amount of currents passing through the NMOS transistors 51 and 53.

A terminal T-11 supplies a reference voltage (Vref) to the gate of an NMOS transistor 48 of the offset circuit.

Next, the circuit configuration of the gain control circuit 10 shown in FIG. 1 will be described below.

The gmi1 circuit constituting the input stage is formed by NMOS transistors 31 to 34 and NMOS transistors 55 and 56. The gmi1 circuit is also referred to as a gm amplifier or a gain control circuit.

From the preceding circuit (not shown), for example, a positive phase input signal is supplied to the terminal T-1, and a negative phase input signal is supplied to the terminal T-1A.

The gate of the NMOS transistor 31 is connected to the terminal T-1, and the source thereof is connected to the drain of the NMOS transistor 55 constituting the current source, the drain of the NMOS transistor 33 and the source of the NMOS transistor 34. The drain of the NMOS transistor 31 is connected to the drain of a PMOS transistor 12. The source of the NMOS transistor 55 is connected to ground (the terminal T-9), and the gate is connected to the terminal T-2. The gate of the NMOS transistor 33 is connected to the terminal T-1. The gate of the NMOS transistor 34 is connected to the terminal T-1A.

The gate of the NMOS transistor 32 is connected to the terminal T-1A, and the source thereof is connected to the drain of the NMOS transistor 56 constituting the current source, the source of the NMOS transistor 33 and the drain of the NMOS transistor 34. The drain of the NMOS transistor 32 is connected to the drain of a PMOS transistor 14. The source of the NMOS transistor 56 is connected to the terminal T-9, and the gate is connected to the terminal T-2.

The gmi2 circuit constituting the input stage is formed by NMOS transistors 35 to 38 and NMOS transistors 57 and 58. The gmi2 circuit is also referred to as a gm amplifier or a gain control circuit.

The gate of the NMOS transistor 35 is connected to the terminal T-1A, and the source thereof is connected to the drain of the NMOS transistor 57 constituting the current source, the drain of the NMOS transistor 37 and the source of the NMOS transistor 38. The drain of the NMOS transistor 35 is connected to the drain of the PMOS transistor 12. The source of the NMOS transistor 57 is connected to the ground (the terminal T-10), and the gate thereof is connected to the terminal T-3. The gate of the NMOS transistor 37 is connected to the terminal T-1A. The gate of the NMOS transistor 38 is connected to the terminal T-1.

The gate of the NMOS transistor 36 is connected to the terminal T-1, and the source thereof is connected to the drain of the NMOS transistor 58 constituting the current source, the source of the NMOS transistor 37 and the drain of the NMOS transistor 38. The drain of the NMOS transistor 36 is connected to the drain of the PMOS transistor 14. The source of the NMOS transistor 58 is connected to the terminal T-9, and the gate thereof is connected to the terminal T-3.

The gmo3 circuit constituting the output stage is formed by PMOS transistors 11 to 14, NMOS transistors 39 to 42 and NMOS transistors 59 to 62, and capacitors 43 and 44. The gmo3 circuit is also referred to as a gm load or a load circuit.

The source of the PMOS transistor 12 is connected to the terminal T-5, the gate thereof is connected to the drains of the PMOS transistors 18 and 20, and the drain thereof is connected to the source of the PMOS transistor 11 and the drains of the NMOS transistors 31 and 35, respectively. The gate of the PMOS transistor 11 is connected to the terminal T-6, and the drain thereof is connected to the drain and the gate of the NMOS transistor 39, and also connected to the gate of the NMOS transistor 41 and one terminal of a resistor 46.

The source of the NMOS transistor 39 is connected to the drains of the NMOS transistors 59 and 60, the drain of the NMOS transistor 41, the source of the NMOS transistor 42 and one terminal of the capacitor 43. The gate of the NMOS transistor 59 is connected to the terminal T-3, and the source thereof is connected to the terminal T-9. The gate of the NMOS transistor 60 is connected to the terminal T-2, and the source thereof is connected to the terminal T-9.

The source of the PMOS transistor 14 is connected to the terminal T-5, the gate thereof is connected to the drains of the PMOS transistors 18 and 20, and the drain thereof is connected to the source of the PMOS transistor 13 and the drains of the NMOS transistors 32 and 36, respectively. The gate of the PMOS transistor 13 is connected to the terminal T-6, and the drain thereof is connected to the drain and the gate of the NMOS transistor 40, and also connected to the gate of the NMOS transistor 42 and one terminal of a resistor 45.

The source of the NMOS transistor 40 is connected to the drains of the NMOS transistors 61 and 62, the source of the NMOS transistor 41, the drain of the NMOS transistor 42 and one terminal of the capacitor 44. The gate of the NMOS transistor 61 is connected to the terminal T-2, and the source thereof is connected to the terminal T-9. The gate of the NMOS transistor 62 is connected to the terminal T-3, and the source thereof is connected to the terminal T-9.

The other terminals of the capacitors 43 and 44 are commonly connected, and connected to the drains of the PMOS transistors 18 and 20, respectively.

The common connecting point of the gate and the drain of the NMOS transistor 39 is connected to the terminal T-7, and an output signal is lead out. The common connecting point of the gate and the drain of the NMOS transistor 40 is connected to the terminal T-7A, and an output signal having a phase opposite to that of the terminal T-7 is lead out.

The offset circuit is formed by the resistors 45 and 46, PMOS transistors 15 to 20, NMOS transistors 47, 48 and 63 and a capacitor 49, which are used to detect a common mode (in-phase) voltage of the gmo3 circuit.

One terminal of the resistor 46 for detecting the in-phase voltage is connected to the common connecting point of the gate and the drain of the NMOS transistor 39 constituting the gmo3 circuit, and one terminal of the resistor 45 for detecting the in-phase voltage is connected to the common connecting point of the gate and the drain of the NMOS transistor 40. The other terminals of the resistors 45 and 46 are connected to each other and connected to the gate of the NMOS transistor 47 constituting the differential circuit of the offset circuit.

The source of the PMOS transistor 17 is connected to the terminal T-5, the drain thereof is connected to the source of the PMOS transistor 16, and the gate thereof is connected to the gate of the PMOS transistor 19 and the drains of the PMOS transistors 15 and 16, respectively. The source of the PMOS transistor 15 is connected to the terminal T-5, and the gate thereof is connected to the terminal T-4.

The gate of the PMOS transistor 16 is connected to the terminal T-6, and the drain thereof is connected to the drain of the NMOS transistor 47. The gate of the NMOS transistor 47 is connected to the other terminals of the resistors 45 and 46, respectively, and the source thereof is connected to the source of the NMOS transistor 48 and the drain of the NMOS transistor 63. The gate of the NMOS transistor 63 is connected to the terminal T-8, and the source thereof is connected to the terminal T-9.

The source of the PMOS transistor 19 is connected to the terminal T-5, the drain thereof is connected to the source of the PMOS transistor 18, and the gate thereof is connected to the gate of the PMOS transistor 17 and the drains of the PMOS transistors 15 and 16, respectively. The source of the PMOS transistor 20 is connected to the terminal T-5, the gate thereof is connected to the terminal T-4, and the drain thereof is connected to the drain of the PMOS transistor 18 and the drain of the NMOS transistor 48.

The gate of the PMOS transistor 18 is connected to the terminal T-6, the drain thereof is connected to the drain of the NMOS transistor 48 and the gates of the PMOS transistors 12 and 14, respectively. The drain of the NMOS transistor 48 is connected to the other terminal of the capacitor 49. One terminal of the capacitor 49 is connected to the gate of the NMOS transistor 47. The gate of the NMOS transistor 48 is connected to the terminal T-11, and the source thereof is connected to the source of the NMOS transistor 47 and the drain of the NMOS transistor 63. The gate of the NMOS transistor 63 is connected to the terminal T-8, and the source thereof is connected to the terminal T-9.

Next, the operation of the gain control circuit 10 will be described.

Input signals are supplied from the terminals T-1 and T-1A to the gmi1 circuit and the gmi2 circuit, respectively. The signal inputted from the terminal T-1 is supplied to the gate of the NMOS transistor 31 and the gate of the NMOS transistor 36. Similarly, the signal inputted from the terminal T-1A is supplied to the gate of the NMOS transistor 32 and the gate of the NMOS transistor 35.

The gain control circuit 10 controls the currents passing through the gmi1 circuit and the gmi2 circuit by supplying the control signals such as control currents from the terminals T-2 and T-3 to a current mirror circuit. Specifically, the positive phase signal current and the negative phase signal current of the output signal current proportional to the mutual conductance gm1 of the gmi1 circuit and the mutual conductance gm2 of the gmi2 circuit are synthesized, for example, added. Then, the mixing ratio of the synthesized signal currents is changed by independently changing the gm1 of the gmi1 circuit and the gm2 of the gmi2 circuit. The synthesized signal currents are then supplied to a gm load circuit, and output signals are lead out. The gain or the attenuation amount of the output signal is controlled by the above-described mixing ratio of the synthesized signal currents.

The operation of the gmi1 circuit will firstly be described.

The NMOS transistors 33 and 34, which are connected between the source of the NMOS transistor 31 and the source of the NMOS transistor 32, operate equivalently as resistors, whereby a phase is shifted.

By the DC current (IVCAP) supplied from the terminal T-2, a predetermined voltage is generated correspondingly to the DC current at the NMOS transistor 51, and the generated voltage is then supplied to the gates of the NMOS transistors 55 and 56 constituting the constant current source. By the control voltage inputted to the terminal T-10, the current passing between the drain and the source of the NMOS transistor 52 is changed, and accordingly the current passing through the NMOS transistor 51 constituting an MOS diode is controlled to adjust the voltage generated at the diode.

The NMOS transistors 55 and 56 form the current mirror circuit together with the NMOS transistor 51 constituting the diode. In accordance with the gate width to the gate length (W/L) ratio, a DC current is determined and the same current as the DC current passing through the drain of the NMOS transistor 55 is passed through the NMOS transistor 31. The same current as the DC current passing through the drain of the NMOS transistor 56 is passed through the NMOS transistor 32.

The NMOS transistors 33 and 34 are connected between the sources of the NMOS transistors 31 and 32, equivalently representing resistors. Therefore, the NMOS transistors 31 and 32 form a differential type gm amplifier.

In accordance with the control current of the terminal T-2, a gm is determined from the current passing through the NMOS transistor 31, and the output signal current outputted from the NMOS transistor 31 has a value obtained by multiplying an input signal ($V_{in}$) by a mutual conductance gm, that is, $id_{31}=gm_{31}*V_{in}$.

Similarly, in the NMOS transistor 32, the output signal current is expressed by $id_{32}=gm_{32}*(-V_{in})$. The symbol "*" denotes multiplication. By changing the $gm_{31}$ and $gm_{32}$, the gain control can be performed to control the output signal currents $id_{31}$ and $id_{32}$. $gm_{31}$ denotes the mutual conductance of the NMOS transistor 31, and $gm_{32}$ denotes the mutual conductance of the NMOS transistor 32.

The operation of the gmi2 circuit will next be described. Similarly, the NMOS transistors 33 and 38, which are connected between the source of the NMOS transistor 35 and the source of the NMOS transistor 36, operate equivalently as resistors, thereby having a phase difference.

By the DC current supplied from the terminal T-3, a predetermined voltage is generated at the NMOS transistor 53 constituting the MOS diode, and the generated voltage is then supplied to the gates of the NMOS transistors 57 and 58 constituting the constant current source. By the control voltage inputted to the terminal T-10, the current passing between the drain and the source of the NMOS transistor 54 is changed, and the current passing through the NMOS transistor 53 constituting an MOS diode is correspondingly controlled to adjust the voltage generated at the diode.

The NMOS transistors 57 and 58 form the current mirror circuit together with the NMOS transistor 53. In accordance with the gate width to the gate length (W/L) ratio, a current is determined and the same current as the DC current passing through the drain of the NMOS transistor 57 is passed through the NMOS transistor 35. The same current as the DC current passing through the drain of the NMOS transistor 58 is passed through the NMOS transistor 36.

The NMOS transistors 37 and 38 are connected between the sources of the NMOS transistors 35 and 36, equivalently representing resistors. Therefore, the NMOS transistors 35 and 36 form a differential type gm amplifier.

In accordance with the control current of the terminal T-1A, a gm is determined from the current passing through the NMOS transistor 35, and the output signal current outputted from the NMOS transistor 35 has a value obtained by multiplying an input signal $(-V_{in})$ by a mutual conductance $gm_{35}$, that is, $id_{35}=gm_{35}*(-V_{in})$.

Similarly, in the NMOS transistor 36, the output signal current is expressed by $id_{36}=gm_{36}*V_{in}$. The symbol "*" denotes multiplication. By changing these two $gm_{35}$ and $gm_{36}$, the gain control can be performed to control the output signal currents $id_{35}$ and $id_{36}$.

$gm_{35}$ denotes the mutual conductance of the NMOS transistor 35, and $gm_{36}$ denotes the mutual conductance of the NMOS transistor 36.

The output signal current $id_{31}$ outputted from the drain of the NMOS transistor 31 and the output signal current $id_{35}$ outputted from the NMOS transistor 35 are synthesized and outputted to the source of the PMOS transistor 11 constituting the gmo3 circuit.

On the other hand, the output signal current $id_{32}$ outputted from the drain of the NMOS transistor 32 and the output signal current $id_{36}$ outputted from the NMOS transistor 36 are synthesized and outputted to the source of the PMOS transistor 13 constituting the gmo3 circuit.

The signal currents supplied to the sources of the PMOS transistors 11 and 13 are outputted to the terminals T-7 and T-7A through the NMOS transistors 39 and 40 of the gm load (the load circuit), respectively.

Here, the NMOS transistors 41 and 42 represent equivalently resistance compositions, and the NMOS transistors 39 and 40 form the differential circuit.

The current of the NMOS transistor 39 has the value obtained by adding the currents supplied from the NMOS transistors 59 and 60 constituting the constant current source. The current corresponding to the voltage generated at the NMOS transistor 53 is passed through the NMOS transistor 59, and the voltage generated at the NMOS transistor 53 is controlled by the control current supplied from the terminal T-3 and the control voltage of the terminal T-10. The current corresponding to the voltage generated at the NMOS transistor 51 is passed through the NMOS transistor 60 and controlled by the control current of the terminal T-2 and the control voltage supplied to the terminal T-10.

The control currents of the terminals T-2 and T-3 can be used to change the DC currents of the NMOS transistors 59 and 60. Alternatively, the current passing through the NMOS transistor 39 can be set at a predetermined value by arbitrarily setting the W/L ratios of the NMOS transistors 59 and 60 with respect to the W/L ratios of the NMOS transistors 51 and 53.

The current of the NMOS transistor 40 has a value obtained by adding the currents supplied from the NMOS transistors 61 and 62 constituting the constant current source. The current corresponding to the voltage generated at the NMOS transistor 51 is passed through the NMOS transistor 61 and the voltage generated at the NMOS transistor 53 is controlled by the control current supplied from the terminal T-1 and the control voltage of the terminal T-10. The current corresponding to the voltage generated at the NMOS transistor 53 is passed through the NMOS transistor 62 and set by the control current of the terminal T-3 and the control voltage supplied to the terminal T-10.

By the control currents of the terminals T-2 and T-3, the currents of the NMOS transistors 61 and 62 can be changed. Alternatively, the current passing through the NMOS transistor 40 can be set at a predetermined value by arbitrarily setting the W/L ratios of the NMOS transistors 61 and 62 with respect to the W/L ratios of the NMOS transistors 51 and 53.

The gain control is performed by holding constant the total of the operating currents of the gmi1 circuit and the gmi2 circuit. Since the gmo3 circuit is in the mutual conductance (gm) load, the DC level of the signals lead out from the terminals T-7 and T-7A can be set arbitrarily.

The current passing through the NMOS transistors 59 to 62 constituting the current source of the gmo3 circuit is fixed and, as needed, this current may be changed to set the center gain at a desired level.

Next, the amount of gain attenuation will be described below. It is expressed as follows:

$$gm1+gm2=K \quad \text{(Numeral 1)}$$

In the following, gm1 is the mutual conductance of the gmi1 circuit, gm2 is the mutual conductance of the gmi2 circuit, and gm3 is the mutual conductance of the gmo3 circuit.

For example, when gm1=gm2=K/2, it is AC-likely that gm2−gm1=0, and the AC signal component is cancelled out, thereby producing no output (the amount of attenuation corresponds to −∞).

For example, when gm1=0, and gm2=K (Numeral 2), the AC gain (Gain) is determined by gm2/gm3, and this corresponds to the maximum gain (MAX Gain).

For example, when gm1=K, and gm2=0 (Numeral 3), the AC gain is determined by gm1/gm3, and this corresponds to the inverse MAX Gain.

Thus, the AC-like gm ratio with respect to an input can be changed, however, taking a DC-like portion into consideration, K/gm3 is always held constant. Hence, the noise (Noise) generated from the gain control circuit 10 not related to AC input, DC offset and frequency characteristic can be always held constant irrespective of AC gain to be set.

If any inverse output is not desired, it is necessary to surely set as follows:

$$gm1 \leq gm2$$

The above setting method can be achieved by a typical method, for example, by providing various types of current limiters. Therefore, no particular limitation is imposed on the method thereof.

Next, the offset circuit (referred also to as a CMFB circuit) will be described below.

One terminal of the resistor 45 and one terminal of the resistor 46 are connected to the common connecting points of the gates and drains of the NMOS transistors 39 and 40 constituting the gmo3 circuit, respectively. The other terminals of the resistors 45 and 46 are commonly connected, and the in-phase voltage detected from the common connecting point is supplied to the gate of the NMOS transistor 47 constituting the offset circuit. A reference voltage (Vref) is supplied from the terminal T-11 to the gate of the NMOS transistor 48 constituting the differential amplifier circuit together with the NMOS transistor 47. With respect to the reference voltage, a differential voltage from the in-phase voltage is amplified, and the amplified in-phase voltage is outputted from the drain of the PMOS transistor 16 constituting an active load, the drain of the NMOS transistor 47, and the drains of the PMOS transistor 18 and the NMOS transistor 48.

The in-phase voltage outputted from the drains of the NMOS transistor 48 and the PMOS transistor 18 is fed back to the gates of the PMOS transistors 12 and 14 constituting the gmo3 circuit, and the current is controlled to cancel the input offset voltage due to the in-phase voltage.

Similarly, the in-phase voltage outputted from the drains of the NMOS transistor 47 and the PMOS transistor 16 is fed back to the gates of the PMOS transistors 17 and 19, and the input offset voltage due to the in-phase voltage is cancelled.

As a result, the difference in offset voltage variations during a gain change period obtained by the gain control circuit 10 of the present invention is 0.5 mV or less, thereby enabling a remarkable improvement compared with a 20 mV in the gain control circuit of the related art.

Thus, the output loads of the gmi1 circuit and the gmi2 circuit are formed by the gm loads called the gmo3 circuit instead of by resistors R, and the total current flown from the current source formed by the PMOS transistors provided on the high potential side of the power source is arranged to be CMFB (common mode feedback). This enables the output DC voltage to be set arbitrarily, without depending on the resistors.

Further, since it is not necessary to match, with high accuracy, the total current flown from the PMOS transistor side with the total current of the NMOS transistor side (the low potential side of the power source), thereby making current setting easy.

As described above, the output DC offset depends on the CMFB accuracy but does not depend on the set gain (Gain). Therefore, in the absence of the input DC offset, even if the gain varies all the times as in the case with AGC, issues in which the offset generated by the gain control (VCA) circuit enters into the necessary input/output AC signal band and can not be removed, may be avoided.

Similarly, there is no possibility that the amount of noise generated by the gain control circuit may be changed by gain (since the signal amplitude is variable, the signal/noise (S/N) ratio appears to change).

For example, if operated with a constant output amplitude as in the AGC, the S/N is also held constant. In the presence of noise compositions of the stages prior to the gain control circuit, some portions may depend on the gain of the gain control circuit.

Figure 2A:
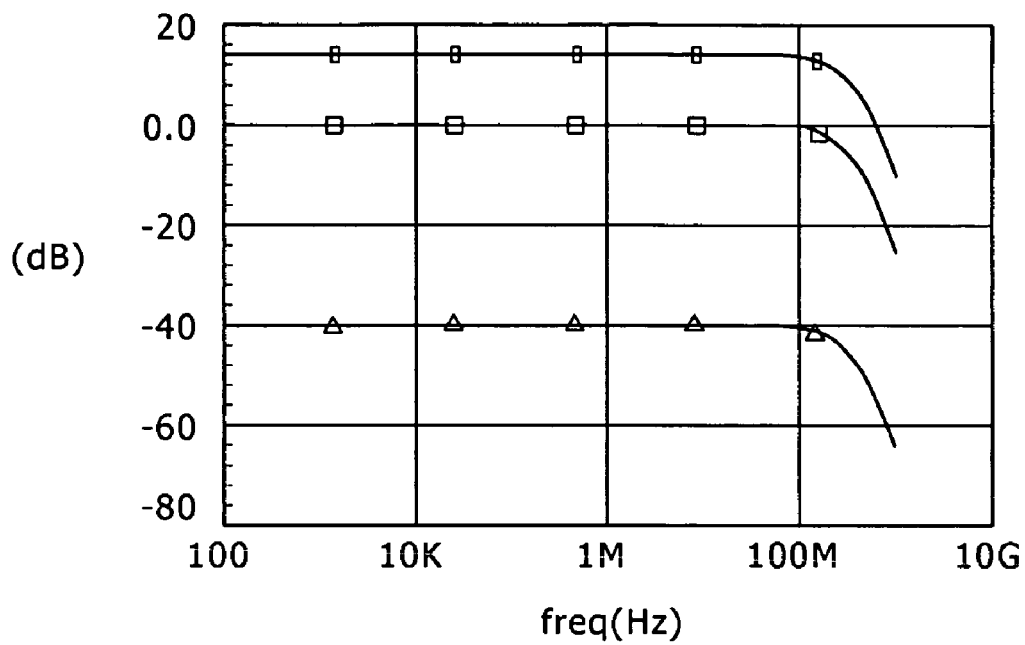
FIGS. 2A and 2B are diagrams showing the electrical characteristics of the gain control circuit shown in FIG. 1 and that of the related art circuit, respectively.
Figure 2B:
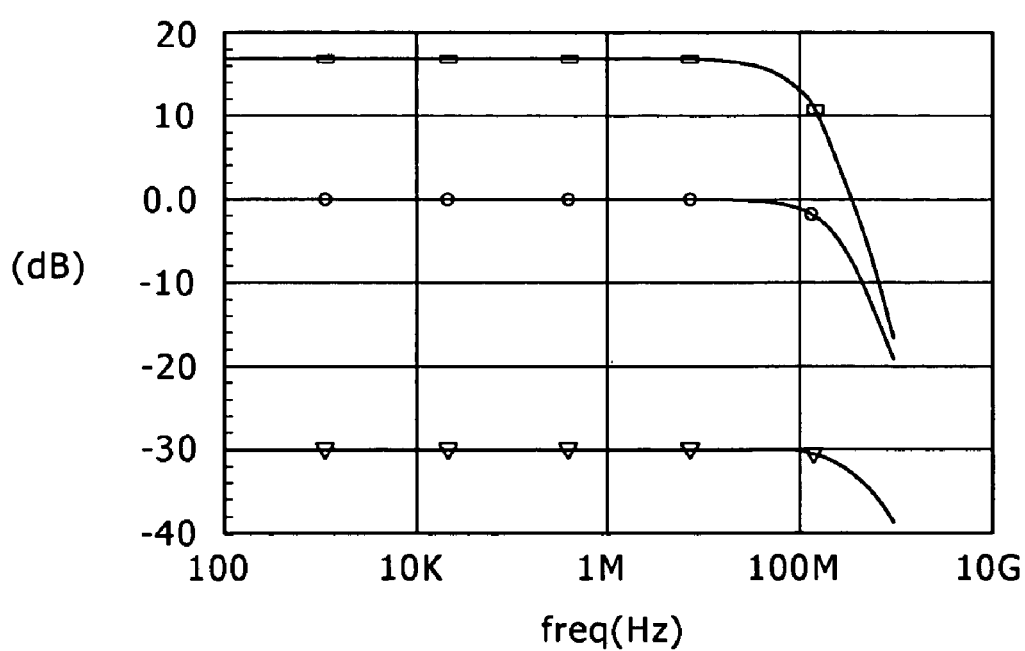

FIG. 2 shows electric characteristics of the gain control circuit 10. FIG. 2A is the diagram of electrical characteristics of the gain control circuit 10 of the present invention. FIG. 2B is the diagram of characteristics of a comparative gain control circuit of the related art.

In FIG. 2A, the ordinate axis of the characteristic diagram represents the attenuation amounts in the range of +20 dB to −80 dB indicated in 20 dB units. The abscissa axis represents frequencies in 100 Hz, 10 KHz, 1 MHz, 100 MHz and 10 GHz.

In FIG. 2B, the ordinate axis of the characteristic diagram represents in the range of +20 dB to −40 dB indicated in 10 dB units. The abscissa axis is the same as FIG. 2A.

As shown in FIGS. 2A and 2B, in the gain control circuit 10 of the present invention, when the gain is +14.7 dB, the frequencies are in the range of 100 Hz to 60 MHz, the gain deviation is −0.1 dB, and the cutoff frequency is 245 MHz. On the other hand, in the gain control circuit of the related art, when the gain is +17.1 dB, the cutoff frequency is 91 MHz and the gain deviation is −1.4 dB. That is, characteristics of the gain control circuit 10 of the present invention are improved.

When the attenuation amount is 0 dB, the gain control circuit 10 of the present invention shows that the gain deviation is −0.1 dB and the cutoff frequency is 245 MHz, whereas the gain control circuit of the related art shows that the gain deviation is −0.3 dB and the cutoff frequency is 211 MHz. Although the gain control circuit of the related art has improvement cutoff frequency, the gain deviation −0.3 dB is relatively large.

When the attenuation amount is 40 dB, the gain control circuit 10 of the invention shows that the gain deviation is −0.1 dB and the cutoff frequency is 245 MHz. On the other hand, when the attenuation amount is −29.7 dB, the gain control circuit of the related art shows that the gain deviation is −0.1 dB and the cutoff frequency is 385 MHz.

Thus, when the attenuation amount is changed in the gain control circuit of the related art, the gain deviation and the cutoff frequency vary greatly in a predetermined frequency range.

However, even when the attenuation amount is changed in the gain control circuit 10 of the present invention, the gain deviation is slight and held substantially constant and the cutoff frequency remain unchanged in a predetermined frequency range (100 Hz to 60 MHz).

In the present embodiment, the input stage (the gmi circuit) is described by the two stages of the gmi1 circuit and the gmi2 circuit. Alternatively, it is also possible to increase the number of stages, for example, from gmi1 circuit to gmin circuit (any number up to gmin circuit), as long as the total current of the gmi circuits can be held constant within a variable range.

For example, even when performing operations of adding or subtracting signals of passages different from signal passages A and B, the operations can be performed by arbitrarily changing the gains of the respective passages, while surely holding the above-mentioned characteristics. Depending on the current setting of the gmi circuit, the negative phase output is also performable, thereby making it possible to switch the operation from addition to subtraction only by the current control of the same circuit.

Although the present embodiment uses the gm amplifiers of the NMOS transistors, the configuration using PMOS transistors allow the same effects.

Although the present embodiment has been described using the MOS transistors, it is also applicable to a bipolar transistor if similar topology is used.

The followings are description of an optical recording and reproducing device having a wobble detection circuit 100 using the gain control circuit 10 of the present invention.

Figure 3:
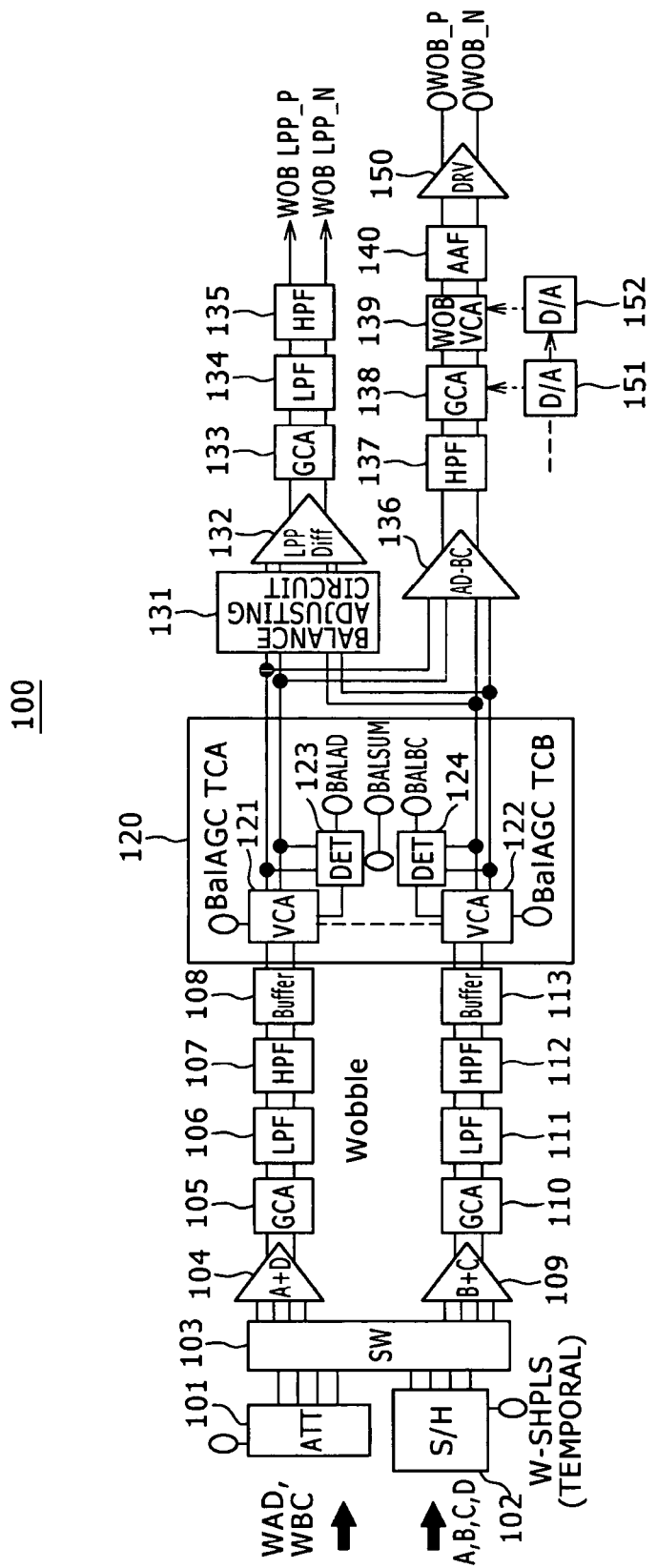
FIG. 3 is a block diagram of a wobble detection circuit using the gain control circuit.

FIG. 3 shows the wobble detection circuit 100 of the optical recording and reproducing device. Otherwise, the block configuration is identical to that in the related art. The description thereof is therefore omitted here.

The wobble detection circuit 100 includes, for example, an ATT circuit (attenuator) 101, an S/H (sample hold) circuit 102, an SW (switch) circuit 103, an amplifier circuit (A+D) 104, a GCA (gain control) circuit 105, an LPF (low pass filter) 106, an HPF (high pass filter) 107, a buffer circuit 108, a balance AGC circuit 120, a balance adjusting circuit 131, an LPP Diff circuit (land pre-pit differential amplifier circuit) 132, a GCA (gain control circuit) 133, an LPF 134, an HPF 135, an amplifier circuit (B+C) 109, a GCA 110, an LPF 111, an HPF 112, a Buffer circuit 113, an amplifier circuit (AD-BC) 136, an HPF 137, a GCA circuit 138, a WOBVCA circuit (wobble voltage control circuit) 139, an AAF (anti-aliasing filter) circuit 140, a DRV (drive) circuit 150 and D/A (digital/analog) converters 151 and 152.

The balance AGC circuit 120 is formed by, for example, the VCA circuits (gain control circuits) 121 and 122, the DET circuits (detectors) 123 and 124 as shown in FIG. 1.

The operation of the wobble detection circuit 100 shown in FIG. 3 will be described below. The reflected light reflected from an optical disc is detected by an optical detector (not shown) configured by PIN diodes divided into four ($P_A$, $P_B$, $P_C$ and $P_D$), and supplied to the ATT circuit 101 as a WAD signal and a WBC signal. The A, B, C and D signals detected by the PIN diodes ($P_A$, $P_B$, $P_C$ and $P_D$) are supplied to the S/H circuit 102 and sample-held, and the held signals are supplied to the SW circuit 103 at a predetermined timing.

From the SW circuit 103, an A+B signal and a B+C signal are outputted, and an A+D signal is supplied to the amplifier circuit (A+D) 104, and a B+C signal is supplied to the amplifier circuit (B+C) 109.

The signal (A+B) is amplified by the amplifier circuit (A+D) 104 and supplied to the GCA (gain control circuit) 105. In the GCA circuit 105, the signal level is varied and hence gain adjustment is performed to hold the amplitude width constant.

The A+B signal in which the amplitude is held constant is supplied to the LPF 106. The LPF 106 attenuates noise and the like at or above the set cutoff frequency, and outputs the resulting signal to the HPF 107. The HPF 107 attenuates low frequency noise equal to or below the set cut off frequency and the low frequency eccentric component and the like of the optical disk which are contained in the A+B signal supplied to the HPF 107. The A+B signal outputted from the HPF 107 is supplied to the gain control (VCA) circuit 121 of the balance AGC circuit 120.

Similarly, the B+C signal inputted to the amplifier circuit (B+C) 109 is supplied to the gain control (VCA) circuit 122 of the balance AGC circuit 120 through the GCA circuit 110, the LPF 111, the HPF 112 and the Buffer circuit 113.

The A+D signal and the B+C signal supplied to the balance AGC circuit 120 are inputted to the terminals T-1 and T-1A of the gain control circuit 10 shown in FIG. 1, and the signal levels are controlled by the gmi1 circuit and the gmi2 circuit, respectively. The signal levels are controlled by using the control currents (IVCAP and ICVAN) supplied from the terminals T-2 and T-3, and then outputted from the terminals T-7 and T-7A through the gmo3 circuit (the gm load), respectively. The current amounts of the gmi1 circuit and the gmi2 circuit are controlled at the terminals T-2 and T-3, respectively, and the mixing ratio of the synthesized output currents are changed to control the levels of the signals. At this time, the total of currents of the gmi1 circuit and the gmi2 circuit is held constant.

Further, the VCA circuits 121 and 122 are provided with the offset circuits to cancel the in-phase voltage of the gmo3 circuit, as shown in FIG. 1. Therefore, the DC level variations of the output voltages of the wobble signals outputted from the terminals (T-7 and T-8) of the gmo3 circuit are extremely smaller than that in the gain control circuit of the related art.

The output signals of the negative and positive phases of the VCA circuit 121 are detected by the DET circuit 123 and fed back to the VCA circuit 121 in order to adjust their respective levels. The same is performed for the VCA 122 and the DET circuit 124.

The output signals of the VCA circuits 121 and 122 are inputted to the balance adjusting circuit 131, thereby adjusting the level of the A+D signal and the level of the B+C signal. The adjusted signals are outputted to the LPP Diff circuit 132, and in the circuit, an LPP (land pre-pit) signal is extracted from the differential signal (A+D)−(B+C). The extracted LPP signal is subjected to signal level control by the GCA circuit 133, and then supplied to the LPF 134 and the HPF 135. Noise and the like other than the LPP signal are removed to lead out a WOBLPP_P (the positive phase of wobble land pre-pit) signal and a WOBLPP_N (the negative phase of wobble land pre-pit) signal.

On the other hand, the A+D signal and the B+C signal lead out of the VCA circuits 121 and 122 are supplied to the amplifier circuit (AD-BC) 136. The signal (A+D)−(B+C) is amplified and outputted to the HPF 137. In The HPF 137, the noise equal to or below the cutoff frequency, the LPP signal and the like are removed to lead out a wobble signal. The wobble signal outputted from the HPF 137 is supplied to the GCA circuit 138, in which gain control is performed by using the analog signal outputted from the D/A (digital/analog) converter.

The wobble signal outputted from the GCA circuit 138 is outputted to the WOBVCA circuit 139 and controlled by the control signal from the D/A converter 152.

With respect to the wobble signal lead out of the WOBVCA circuit 139, a wobble signal WOB_P (the positive phase of the wobble signal) signal and a WOB_N (the negative phase of the Wobble signal) are outputted through the AAF circuit 140 and the DRV (drive) circuit 150.

The above-mentioned VCA circuits 121 and 122 of the AGC circuit 120 are invariable with respect to DC, thus being free from offset variations and noise variations caused by the gain change. The outputs of the VCA circuits 121 and 122 are also invariable with respect to DC, and the gain is determined by the MIX (mixing) ratio between the positive phase and the negative phase to be outputted from the gmi1 circuit and the gmi2 circuit constituting the VCA circuits 121 and 122. Consequently, the frequency characteristics within the variable range cause no variation, permitting a considerably wide variable width (see FIG. 2).

Although the wobble detection circuit 100 having the above-mentioned configuration is directed to the DVD-R/WR that can also detect the LPP signal, it is also applicable to the gain control circuits of optical recording and reproducing devices for reproducing the recorded information from an optical disk storage medium having no LPP, such as CD-R, CD+R, DVD+R, DVD+RW and DVD-RAM.

As described above, in the gain control circuit or the gain control circuit in the optical recording and reproducing device according to the present invention, the output signals are invariable with respect to DC, and therefore the gain change cause neither offset variations nor noise variations. Additionally, the output signals thereof are invariable with respect to DC, and the gain is determined by the MIX ratio between the positive phase and the negative phase. Hence, the frequency characteristics within the variable range cause no variations, permitting a considerably wide variable width.

The input stage of the gain control circuit can be formed by multistage or a plurality of gm circuits, making it possible to provide a center gain adjusting stage, apart from the configuration of mainly performing gain control. This enables multi-input operation and gain control to be performed at the same time.

Since the output DC level is of the mode independent of the gain control, it can be set arbitrarily irrespective of the gain variable range and input/output dynamic range.

Compared with the related art method of providing a plurality of gain control circuits, all the can be realized by a single gain control circuit, thereby reducing the number of elements and the layout area.

Further, the frequency characteristic does not be varied from MIN (minimum) gain to MAX (maximum) gain, thereby eliminating the necessity of a large frequency characteristic margin for ensuring the necessary band as has been dome, and permitting a reduction in consumption current.

The gain control circuit corresponds to the gmi1 circuit, the gmi2 circuit, the gmo3 circuit and the offset circuit shown in FIG. 1, and also corresponds to the VCA circuit 121, 122 of FIG. 3. The control signal supply section for supplying the first control signal and the second control signal corresponds to the terminals T-1 and T-2. The first gain control circuit corresponds to the gmi1 circuit in the figure. In the first gain control circuit, the positive and negative phase input signals are supplied, gain is changed based on the first control signal, and the positive and negative phase output signals are outputted. The second gain control circuit corresponds to the gmi2 circuit. In the second gain control circuit, the positive and negative phase input signals are supplied, gain is changed based on the second control signal, and the positive and negative phase output signals are outputted. The load circuit corresponds to the gmo3 circuit. In the load circuit, the positive phase output signal of the first gain control circuit and the negative phase output signal of the second gain control circuit are synthesized and supplied to the first input terminal, and the negative phase output signal of the first gain control circuit and the positive phase output signal of the second gain control circuit are synthesized and supplied to the second input terminal, and the synthesized signals are lead out through the mutual conductance set based on the first control signal and the second control signal, as output signals respectively.

It should be understood by those skilled in the art that various modifications, combinations, sub-combinations and alterations may occur depending on design requirements and other factors insofar as they are within the scope of the appended claims or the equivalents thereof.

The present document contains subject matter related to Japanese Patent Application No. 2007-239264 filed in the Japanese Patent Office on Sep. 14, 2007, the entire content of which being incorporated herein by reference.

What is claimed is:

1. A gain control circuit to determine gain by a current ratio of mutual conductance, comprising:
   a first gain control circuit in which positive and negative phase input signals are supplied, gain is changed based on a first control signal, and positive and negative phase output signals are outputted;
   a second gain control circuit in which the positive and negative phase input signals are supplied, gain is changed based on a second control signal, and the positive and negative phase output signals are outputted; and
   a load circuit in which the positive phase output signal of the first gain control circuit and the negative phase output signal of the second gain control circuit are synthesized and supplied to a first input terminal, and the negative phase output signal of the first gain control circuit and the positive phase output signal of the second gain control circuit are synthesized and supplied to a second input terminal, and the synthesized signals are lead out through mutual conductance set based on the first control signal and the second control signal, respectively.

2. The gain control circuit according to claim 1, wherein the first gain control circuit and the second gain control circuit control levels of output signals by changing a mixing ratio of currents of output signals.

3. The gain control circuit according to claim 2, wherein the first gain control circuit and the second gain control circuit hold constant total of operating currents.

4. The gain control circuit according to claim 1, wherein the load circuit outputs a signal current.

5. The gain control circuit according to claim 4, wherein the load circuit includes a mutual conductance amplifier circuit in which currents are constant or regular during a gain change time period.

6. The gain control circuit according to claim 5, wherein the load circuit adjusts output load impedance by using a current in accordance with the first and the second control signals.

7. The gain control circuit according to claim 1, wherein the load circuit includes an offset circuit to set at an arbitrary DC level independently of gain by feeding back a common mode voltage of an output DC voltage.

8. An optical recording and reproducing device to control rotation of an optical disc by detecting an optical signal and reproducing a wobble signal and an RF signal, said device comprising:
   a wobble detection circuit which detects the wobble signal and has a gain control circuit which is for determining gain by a current ratio of mutual conductance,
   wherein, the gain control circuit includes
   (a) a first gain control circuit in which positive and negative phase input signals are supplied, gain being changed based on a first control signal, and positive and negative phase output signals are outputted,
   (b) a second gain control circuit in which the positive and negative phase input signals are supplied, gain is changed based on a second control signal, and the positive and negative phase output signals are outputted, and
   (c) a load circuit in which the positive phase output signal of the first gain control circuit and the negative phase output signal of the second gain control circuit are synthesized and supplied to a first input terminal, and the negative phase output signal of the first gain control circuit and the positive phase output signal of the second gain control circuit are synthesized and supplied to a second input terminal, and the synthesized signals are lead out through the mutual conductance set based on the first control signal and the second control signal, respectively.

9. The optical recording and reproducing device according to claim 8, wherein the first gain control circuit and the second gain control circuit control level of output signals by changing a mixing ratio of currents of the output signals.

10. The optical recording and reproducing device according to claim 8, wherein the total of operating currents of the first gain control circuit and the second gain control circuit is held constant.

11. The optical recording and reproducing device according to claim 8, wherein the load circuit includes an offset circuit to set at an arbitrary DC level independently of gain by feeding back a common mode voltage of an output DC voltage.

* * * * *